(12) United States Patent
Stowell et al.

(10) Patent No.: US 9,695,503 B2
(45) Date of Patent: Jul. 4, 2017

(54) HIGH POWER IMPULSE MAGNETRON SPUTTERING PROCESS TO ACHIEVE A HIGH DENSITY HIGH SP3 CONTAINING LAYER

(71) Applicant: Applied Materials, Inc., Santa Clara, CA (US)

(72) Inventors: Michael W. Stowell, Loveland, CO (US); Yongmei Chen, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/820,152

(22) Filed: Aug. 6, 2015

(65) Prior Publication Data
US 2016/0053366 A1 Feb. 25, 2016

Related U.S. Application Data

(60) Provisional application No. 62/040,809, filed on Aug. 22, 2014.

(51) Int. Cl.
*C23C 14/34* (2006.01)
*C23C 14/35* (2006.01)
(Continued)

(52) U.S. Cl.
CPC .......... *C23C 14/35* (2013.01); *C23C 14/0611* (2013.01); *C23C 16/272* (2013.01);
(Continued)

(58) Field of Classification Search
CPC ... C23C 14/0611; C23C 14/35; C23C 16/272; C23C 16/50; H01L 21/02115; H01L 21/02266
(Continued)

(56) References Cited

U.S. PATENT DOCUMENTS 4,783,368 A * 11/1988 Yamamoto .......... H01L 21/4803
257/E23.006
5,688,382 A * 11/1997 Besen ...................... C23C 14/34
204/192.12
(Continued)

OTHER PUBLICATIONS

Lin et al., "Diamond like carbon films deposited by HiPIMS using oscillatory voltage pulses", Surface & Coatings Technology 258 (Jul. 9, 2014) 1212-1222.*

(Continued)

*Primary Examiner* — Rodney McDonald
(74) *Attorney, Agent, or Firm* — Patterson + Sheridan, LLP

(57) ABSTRACT

Methods for depositing a nanocrystalline diamond layer are disclosed herein. The method can include delivering a sputter gas to a substrate positioned in a processing region of a first process chamber, the first process chamber having a carbon-containing sputter target, delivering an energy pulse to the sputter gas to create a sputtering plasma, the sputtering plasma having a sputtering duration, the energy pulse having an average power between 1 W/cm$^2$ and 10 W/cm$^2$ and a pulse width which is less than 100 µs and greater than 30 µs, the sputtering plasma being controlled by a magnetic field, the magnetic field being less than 300. Gauss, and delivering the sputtering plasma to the sputter target to form an ionized species, the ionized species forming a crystalline carbon-containing layer on the substrate.

17 Claims, 8 Drawing Sheets

(51) Int. Cl.
  *H01L 21/02* (2006.01)
  *C23C 14/06* (2006.01)
  *C23C 16/27* (2006.01)
  *C23C 16/50* (2006.01)

(52) U.S. Cl.
  CPC ........ *C23C 16/50* (2013.01); *H01L 21/02115* (2013.01); *H01L 21/02266* (2013.01)

(58) Field of Classification Search
  USPC .................................................... 204/192.16
  See application file for complete search history.

(56) References Cited

U.S. PATENT DOCUMENTS

| | | |
|---|---|---|
| 2004/0026235 A1 | 2/2004 | Stowell |
| 2007/0104867 A1 | 5/2007 | Haba |
| 2008/0053819 A1 | 3/2008 | Hong et al. |
| 2008/0099326 A1 | 5/2008 | Ye et al. |
| 2011/0274852 A1 | 11/2011 | Ito et al. |
| 2013/0146443 A1* | 6/2013 | Papa ................. C23C 14/35 204/192.16 |
| 2015/0348824 A1* | 12/2015 | Kuenle ............... H01L 21/762 257/506 |

OTHER PUBLICATIONS

International Search Report and Written Opinion of related application PCT/US2015/045318.

Paul K. Chu et al., "Characterization of amorphous and nanocrystalline carbon films", Materials Chemistry and Physics 96 (2006) 253-277.

* cited by examiner

HIGH POWER IMPULSE MAGNETRON SPUTTERING PROCESS TO ACHIEVE A HIGH DENSITY HIGH SP3 CONTAINING LAYER

CROSS-REFERENCE TO RELATED APPLICATIONS

This application claims priority to U.S. Provisional Patent Application Ser. No. 62/040,809, filed on Aug. 22, 2014, which is incorporated by reference herein.

BACKGROUND

Field

Embodiments disclosed herein generally relate to methods for deposition of a film. More specifically, embodiments an apparatus and methods of depositing a nanocrystalline diamond film for use in semiconductor devices.

Description of the Related Art

As the semiconductor industry introduces new generations of integrated circuits (IC's) having higher performance and greater functionality, the density of the elements that form those IC's is increased, while the dimensions, size and spacing between the individual components or elements are reduced. While in the past such reductions were limited only by the ability to define the structures using photolithography, device geometries having dimensions measured in micrometers (μm) or nanometers (nm) have created new limiting factors, such as the conductivity of the conductive interconnects, the dielectric constant of the insulating material(s) used between the interconnects, etching the small structures or other challenges in 3D NAND or DRAM form processes. These limitations may be benefited by more durable, higher thermal conductivity and higher hardness hardmasks.

A thick carbon hardmask is well known and commonly used as POR film. However, current graphitic, Sp2 type or other carbon hardmask compositions are expected to be insufficient as DRAM and NAND continue their scaling down to under ~10 nm regime. This downscaling will require even higher aspect ratio deep contact hole or trench etch. The high aspect ratio etch issues include clogging, hole-shape distortion, and pattern deformation, top critical dimension blow up, line bending, profile bowing are generally observed in these applications. Many etch challenges are dependent on the hardmask material property. Deep contact hole deformation can be related to lower hardmask density and poor thermal conductivity. Slit pattern deformation or line bending is due to hardmask material lower selectivity and stress. Therefore, it is desirable to have an etch hardmask with higher density, higher etch selectivity, lower stress and excellent thermal conductivity.

Diamond and diamond like materials are known as high hardness materials. Due to their high hardness, surface inertness, and low friction coefficient, synthetic diamond materials have been applied as a protective coating and in microelectromechanical systems (MEMS) among other uses. Diamond films, such as nanocrystalline diamond (NCD), have been synthesized by hot filament CVD and microwave CVD. However, there are a variety of difficulties with the use of hot filament CVD and microwave CVD processes to form nanocrystalline diamond films.

In hot filament CVD, a metal filament is used to activate the precursor gases for deposition. As expected, the metal filament is exposed to the precursor gases during the film forming process. As a result, precursor gases can react with the metal filament leading to metal contamination issues in the final product. Compared to hot filament CVD, microwave CVD has fewer contaminant issues. However, microwave CVD requires a high process pressure which can affect the film uniformity. Moreover, while microwave generated plasma created by microwave CVD hardware has relatively low ion energies, these generated ions can still attack the NCD grain boundary and induce grain structure disorder.

Therefore, there is a need for improved apparatus and methods for forming high quality diamond films.

SUMMARY

Embodiments disclosed herein generally relate to nanocrystalline diamond layers as applied to semiconductor devices. By controlling the magnetic field strength provided by a magnetron positioned near a sputtering target, the amount of energy in pulses applied to the sputtering target and/or the pulse width, nanocrystalline diamond films having desirable properties may be formed on a substrate at low temperatures. These nanocrystalline diamond films may be used in a variety of operations, such as the nanocrystalline diamond layer acting as a hardmask during lithography and etching processes. In one embodiment, a method of forming a carbon-containing layer, can include delivering a sputter gas to a substrate positioned in a processing region of a first process chamber, the first process chamber having a carbon-containing sputter target, delivering an energy pulse to the sputter gas to create a sputtering plasma, the sputtering plasma being formed by energy pulses having an average power between about 1 W/cm$^2$ and about 10 W/cm$^2$ and a pulse width which is less than 100 μs and greater than 30 μs. The sputtering plasma being controlled by a magnetic field, the magnetic field being less than 300 Gauss, and forming the sputtering plasma to form a crystalline carbon-containing layer on the substrate.

In another embodiment, a method for forming a carbon-containing layer can include delivering a sputtering gas to a region formed between a target and a substrate, the substrate positioned in a processing region of a first process chamber, the first process chamber having a graphitic target, delivering an energy pulse to the sputter gas to create a sputtering plasma, the sputtering plasma being formed by an energy pulse having an average power between about 1 W/cm$^2$ and about 10 W/cm$^2$ and a pulse width which is less than 100 μs. The sputtering plasma being controlled by a magnetic field, the average magnetic field strength being less than 300 Gauss, and forming the sputtering plasma to so that an intermediate carbide layer is formed on the substrate. Then transferring the substrate having the intermediate carbide layer to a second process chamber, delivering a deposition gas to the second process chamber, activating the deposition gas to create an activated deposition gas, the deposition gas comprising $CH_4$, $H_2$, Ar, $CO_2$ or combinations thereof, delivering the activated deposition gas to a substrate, and growing a nanocrystalline diamond layer on a surface of the substrate.

In another embodiment, a method for forming a carbon containing layer can include delivering an inert gas to a substrate positioned in a processing region of a PVD process chamber, the PVD process chamber having a graphitic sputter target, maintaining the substrate at a temperature of less than 100 degrees Celsius, delivering an energy pulse to the sputter gas to create a sputtering plasma, the sputtering plasma being formed by an energy pulse having an average power between about 1 W/cm$^2$ and about 10 W/cm$^2$ and a pulse width which is less than 100 μs. The sputtering plasma being controlled by a magnetic field, the magnetic field being less than or equal to 200 Gauss, and delivering the sputtering plasma to the sputter target to form a nanocrystalline diamond layer on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to a nanocrystalline diamond layer formed on a substrate. Nanocrystalline diamond layers formed by the processes described herein generally have a higher mass density, higher etch selectivity, lower stress and excellent thermal conductivity needed for forming integrated circuit (IC) devices having small feature sizes. Embodiments are more clearly described with reference to the figures below.

Figure 1:
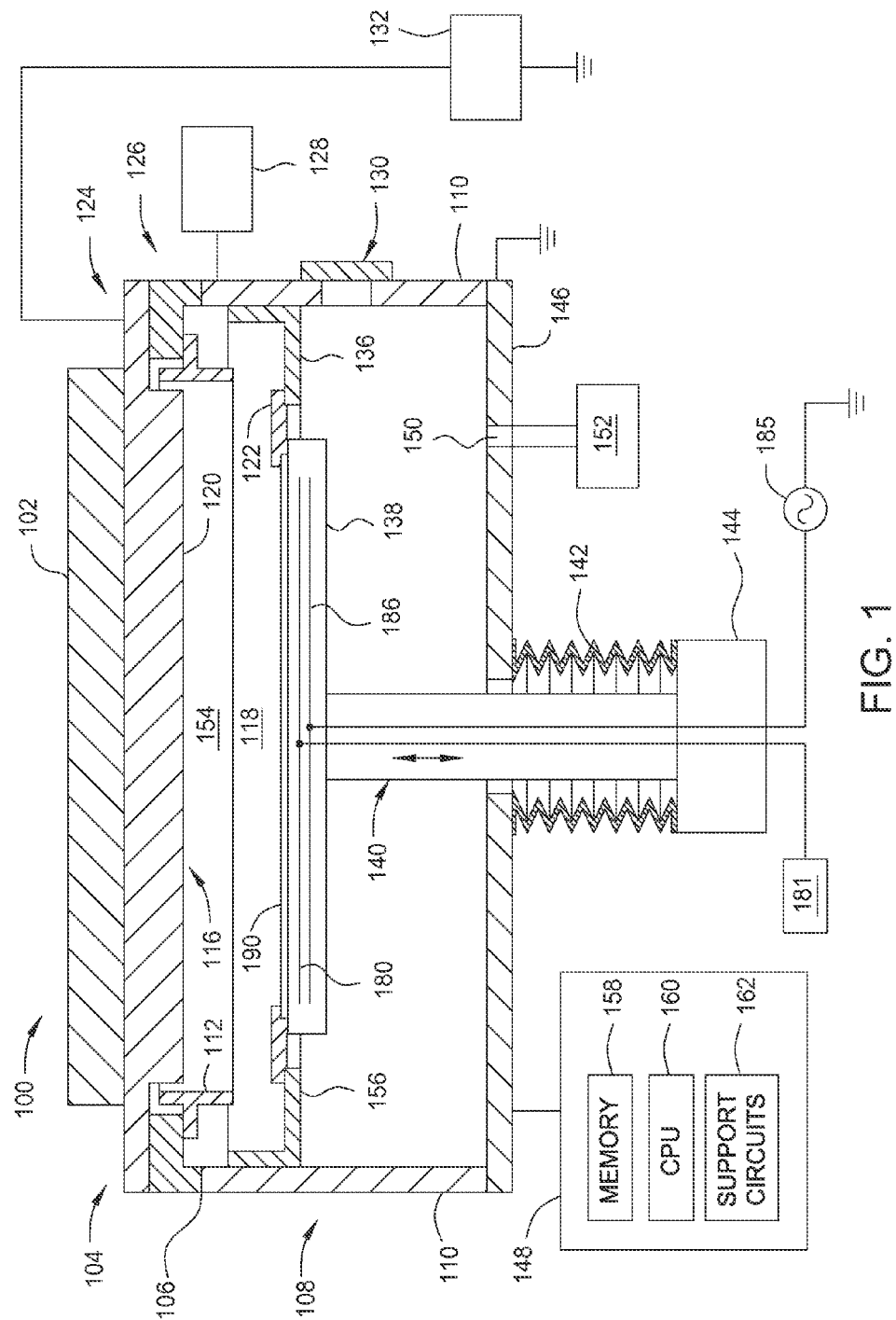
FIG. 1 is a schematic cross-sectional view of a PVD process chamber useable with embodiments described herein.

FIG. 1 illustrates an exemplary physical vapor deposition (PVD) process chamber 100 (e.g., a sputter process chamber) suitable for sputter depositing materials using a high power impulse magnetron sputtering (HIPIMS) process. One example of the process chamber that may be adapted to form the nanocrystalline diamond layer is a PVD process chamber, available from Applied Materials, Inc., located in Santa Clara, Calif. It is contemplated that other sputter process chambers, including those from other manufactures, may be adapted to practice the present invention.

The process chamber 100 includes a chamber body 108 having a processing volume 118 defined therein. The chamber body 108 has sidewalls 110 and a bottom 146. The dimensions of the chamber body 108 and related components of the process chamber 100 are not limited and generally are proportionally larger than the size of the substrate 190 to be processed. Any suitable substrate size may be processed. Examples of suitable substrate sizes include substrate with 200 mm diameter, 300 mm diameter, 450 mm diameter or larger.

A chamber lid assembly 104 is mounted on the top of the chamber body 108. The chamber body 108 may be fabricated from aluminum or other suitable materials. A substrate access port 130 is formed through the sidewall 110 of the chamber body 108, facilitating the transfer of a substrate 190 into and out of the process chamber 100. The access port 130 may be coupled to a transfer chamber and/or other chambers of a substrate processing system.

A gas source 128 is coupled to the chamber body 108 to supply process gases into the processing volume 118. In one embodiment, process gases may include inert gases, non-reactive gases, and reactive gases if necessary. Examples of process gases that may be provided by the gas source 128 include, but not limited to, argon gas (Ar), helium (He), neon gas (Ne), krypton (Kr), xenon (Xe), nitrogen gas ($N_2$), oxygen gas ($O_2$), hydrogen gas ($H_2$), forming gas ($N_2+H_2$), ammonia ($NH_3$), methane ($CH_4$), carbon monoxide (CO), and/or carbon dioxide ($CO_2$), among others.

A pumping port 150 is formed through the bottom 146 of the chamber body 108. A pumping device 152 is coupled to the processing volume 118 to evacuate and control the pressure therein. A pumping system and chamber cooling design enables high base vacuum (1E-8 Torr or less) and low rate-of-rise (1,000 mTorr/min) at temperatures suited to thermal budget needs, e.g., −25 degrees Celsius to +650 degrees Celsius. The pumping system is designed to provide precise control of process pressure which is a critical parameter for crystal structure (e.g., Sp3 content), stress control and tuning. Process pressure may be maintained in the range of between about 1 mTorr and about 500 mTorr, such as between about 2 mTorr and about 20 mTorr.

The lid assembly 104 generally includes a target 120 and a ground shield assembly 126 coupled thereto. The target 120 provides a material source that can be sputtered and deposited onto the surface of the substrate 190 during a PVD process. Target 120 serves as the cathode of the plasma circuit during DC sputtering.

The target 120 or target plate may be fabricated from a material utilized for the deposition layer, or elements of the deposition layer to be formed in the chamber. A high voltage power supply, such as a power source 132, is connected to the target 120 to facilitate sputtering materials from the target 120. In one embodiment, the target 120 may be fabricated from a carbon containing material, such as a material including graphite, amorphous carbon, combinations thereof, or the like. The target could also be graphitic and/or contain Sp2 type carbon material structures. The deposition process may benefit from the use of an Sp2 material containing deposition target for the deposition of an Sp3 layer, as Sp2 carbon materials are structurally closer to Sp3, than other less structured carbon targets. In one embodiment, the target is a graphitic target. The power source 132, or power supply, can provide power to the target in a pulsed (as opposed to constant) manner. That is, power supply can provide power to target by providing a number of pulses to target.

The target 120 generally includes a peripheral portion 124 and a central portion 116. The peripheral portion 124 is disposed over the sidewalls 110 of the chamber. The central portion 116 of the target 120 may have a curvature surface slightly extending towards the surface of the substrate 190 disposed on a substrate support 138. In some embodiments, the spacing between the target 120 and the substrate support 138 is maintained between about 50 mm and about 250 mm. It is noted that the dimension, shape, materials, configuration and diameter of the target 120 may be varied for specific process or substrate requirements. In one embodiment, the target 120 may further include a backing plate having a central portion bonded and/or fabricated by a material desired to be sputtered onto the substrate surface.

The lid assembly 104 may further comprise a full face erosion magnetron cathode 102 mounted above the target 120 which enhances efficient sputtering materials from the target 120 during processing. The full face erosion magnetron cathode 121 allows easy and fast process control and tailored film properties while ensuring consistent target erosion and uniform deposition across the wafer. Examples of a magnetron assembly include a linear magnetron, a serpentine magnetron, a spiral magnetron, a double-digitated magnetron, a rectangularized spiral magnetron, among others shapes to form a desired erosion pattern on the target face and enable a desirable sheath formation during pulsed or DC plasma stages of the process. In some configurations, the magnetron may include permanent magnets that are positioned in a desirable pattern over a surface of the target, such as one of the patterns described above (e.g., linear, serpentine, spiral, double digitated, etc.). In other configurations, a variable magnetic field type magnetron having a desirable pattern may alternately, or even in addition to permanent magnets, be used to adjust the shape and/or density of the plasma throughout one or more portions of a HIPMS process.

The ground shield assembly 126 of the lid assembly 104 includes a ground frame 106 and a ground shield 112. The ground shield assembly 126 may also include other chamber shield member, target shield member, dark space shield, and dark space shield frame. The ground shield 112 is coupled to the peripheral portion 124 by the ground frame 106 defining an upper processing region 154 below the central portion of the target 120 in the processing volume 118. The ground frame 106 electrically insulates the ground shield 112 from the target 120 while providing a ground path to the chamber body 108 of the process chamber 100 through the sidewalls 110. The ground shield 112 constrains plasma generated during processing within the upper processing region 154 and dislodges target source material from the confined central portion 116 of the target 120, thereby allowing the dislodged target source material to be mainly deposited on the substrate surface rather than chamber sidewalls 110.

A shaft 140 extending through the bottom 146 of the chamber body 108 couples to a lift mechanism 144. The lift mechanism 144 is configured to move the substrate support 138 between a lower transfer position and an upper processing position. A bellows 142 circumscribes the shaft 140 and coupled to the substrate support 138 to provide a flexible seal there between, thereby maintaining vacuum integrity of the chamber processing volume 118.

The substrate support 138 may be an electro-static chuck and have an electrode 180. The substrate support 138, when using the electro-static chuck (ESC) embodiment, uses the attraction of opposite charges to hold both insulating and conducting type substrates 190 and is powered by DC power supply 181. The substrate support 138 can include an electrode embedded within a dielectric body. The DC power supply 181 may provide a DC chucking voltage of about 200 to about 2000 volts to the electrode. The DC power supply 181 may also include a system controller for controlling the operation of the electrode 180 by directing a DC current to the electrode for chucking and de-chucking the substrate 190.

The temperature of the PVD process may be kept below the temperature at which the deposited film properties may become undesirable. For example, temperature may be less than about 250 degrees Celsius and have about a 50 degrees Celsius margin to assist in depositing a nanocrystalline diamond layer or an intermediate carbide layer. The substrate support 138 performs in the temperature range required by the thermal budget of the device integration requirements. For example, the substrate support 138 may be a detachable ESC (DTESC) for minus 25 degrees Celsius to 100 degrees Celsius temperature range, Mid-Temp ESC (MTESC) for 100 degrees Celsius to 200 degrees Celsius temperature range, High Temperature or High Temperature Biasable or High Temperature High Uniformity ESC (HTESC or HTBESC or HTHUESC) for temperatures ranging from 200 degrees Celsius to 500 degrees Celsius which ensures fast and uniform heating up of wafers.

After the process gas is introduced into the process chamber 100, the gas is energized to form plasma so that the HIPIMS type PVD process can be performed. An example of a HIPIMS type PVD process is described further below.

A shadow frame 122 is disposed on the periphery region of the substrate support 138 and is configured to confine deposition of source material sputtered from the target 120 to a desired portion of the substrate surface. A chamber shield 136 may be disposed on the inner wall of the chamber body 108 and have a lip 156 extending inward to the processing volume 118 configured to support the shadow frame 122 disposed around the substrate support 138. As the substrate support 138 is raised to the upper position for processing, an outer edge of the substrate 190 disposed on the substrate support 138 is engaged by the shadow frame 122 and the shadow frame 122 is lifted up and spaced away from the chamber shield 136. When the substrate support 138 is lowered to the transfer position adjacent to the substrate transfer access port 130, the shadow frame 122 is set back on the chamber shield 136. Lift pins (not shown) are selectively moved through the substrate support 138 to list the substrate 190 above the substrate support 138 to facilitate access to the substrate 190 by a transfer robot or other suitable transfer mechanism.

A controller 148 is coupled to the process chamber 100. The controller 148 includes a central processing unit (CPU) 160, a memory 158, and support circuits 162. The controller 148 is utilized to control the process sequence, regulating the gas flows from the gas source 128 into the process chamber 100 and controlling ion bombardment of the target 120. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 148 that controls the process chamber 100, such that the processes are performed in accordance with the present invention. The software routines may also be stored and/or executed by a second controller (not shown) that is located remotely from the process chamber 100.

During processing, material is sputtered from the target 120 and deposited on the surface of the substrate 190. In some configurations, the target 120 is biased relative to ground or substrate support, by the power source 132 to generate and maintain a plasma formed from the process gases supplied by the gas source 128. The ions generated in the plasma are accelerated toward and strike the target 120, causing target material to be dislodged from the target 120. The dislodged target material forms a layer on the substrate 190 with a desired crystal structure and/or composition. RF, DC or fast switching pulsed DC power supplies or combinations thereof provide tunable target bias for precise control of sputtering composition and deposition rates for the nanocrystalline diamond material.

The power source 132 is a HIPIMS power source. A typical HIPIMS power source 132 used herein is configured to deliver power impulses with high voltages, such as between about 1 megavolts (MV) and about 8 MV over short durations, between about 10 μs and about 200 μs. A discussion of the HIPIMS process is further described below in conjunction with FIGS. 4A-4B and 7A-7B.

In some embodiments, it is also desirable to separately apply a bias to the substrate during different phases of the nanocrystalline diamond layer deposition process. Therefore, a bias may be provided to a bias electrode 186 (or chuck electrode 180) in the substrate support 138 from a source 185 (e.g., DC and/or RF source), so that the substrate 190 will be bombarded with ions formed in the plasma during one or more phases of the deposition process. In some process examples, the bias is applied to the substrate after the nanocrystalline diamond film deposition process has been performed. Alternately, in some process examples, the bias is applied during the nanocrystalline diamond film deposition process. A larger negative substrate bias will tend to drive the positive ions generated in the plasma towards the substrate or vice versa, so that they have a larger amount of energy when they strike the substrate surface.

Figure 2:
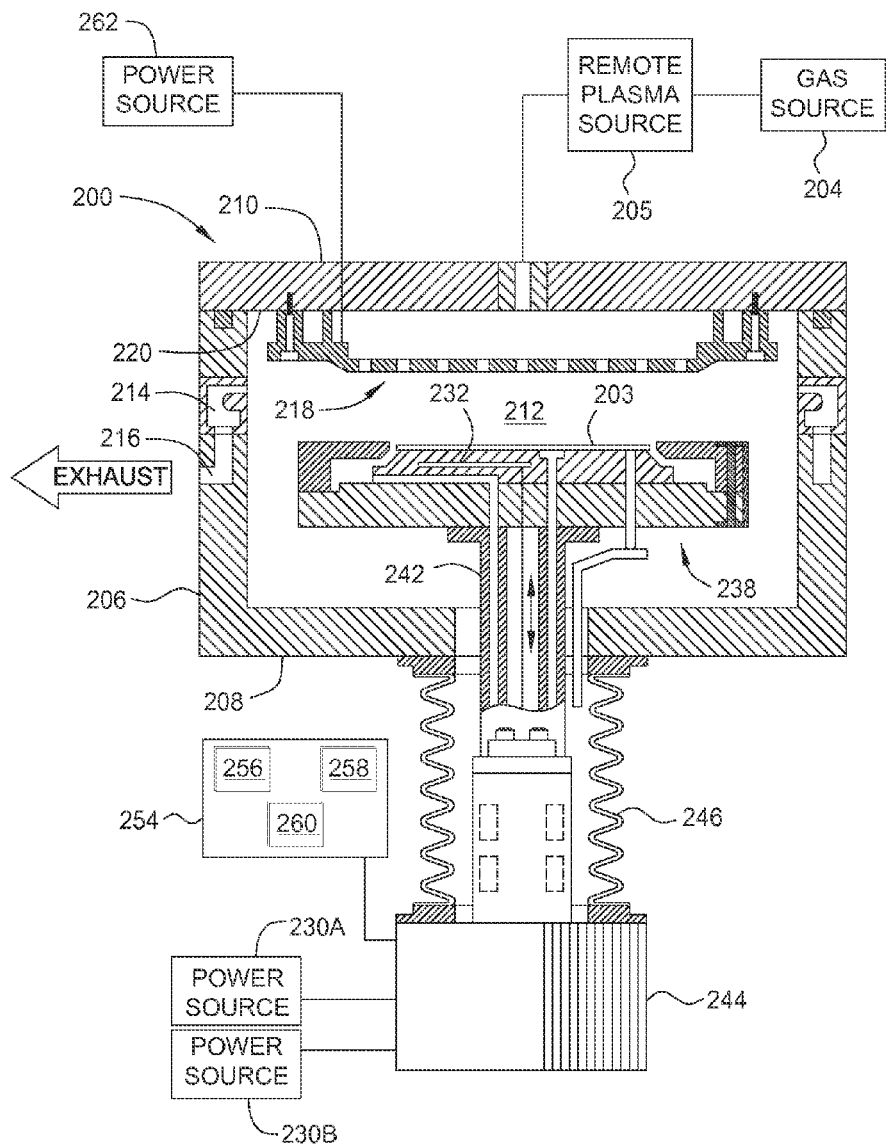
FIG. 2 is a schematic cross-sectional view of a CVD process chamber useable with embodiments described herein.

FIG. 2 is a schematic cross-sectional view of a process chamber 200 that may be used for depositing a carbon based layer according to the embodiments described herein. A process chamber that may be adapted to perform the carbon layer deposition methods described herein is the PRODUCER® chemical vapor deposition chamber, available from Applied Materials, Inc. located in Santa Clara, Calif. It is to be understood that the chamber described below is an exemplary embodiment and other chambers, including chambers from other manufacturers, may be used with or modified to match embodiments of this invention without diverging from the inventive characteristics described herein.

The process chamber 200 may be part of a processing system that includes multiple process chambers connected to a central transfer chamber and serviced by a robot. In one embodiment, the processing system is the cluster tool 300, described in FIG. 3. The process chamber 200 includes walls 206, a bottom 208, and a lid 210 that define a process volume 212. The walls 206 and bottom 208 can be fabricated from a unitary block of aluminum. The process chamber 200 may also include a pumping ring 214 that fluidly couples the process volume 212 to an exhaust port 216 as well as other pumping components (not shown).

A substrate support assembly 238, which may be heated, may be centrally disposed within the process chamber 200. The substrate support assembly 238 supports a substrate 203 during a deposition process. The substrate support assembly 238 generally is fabricated from aluminum, ceramic or a combination of aluminum and ceramic, and includes at least one bias electrode 232. The bias electrode 232 may be an e-chuck electrode, an RF substrate bias electrode or combinations thereof.

A vacuum port may be used to apply a vacuum between the substrate 203 and the substrate support assembly 238 to secure the substrate 203 to the substrate support assembly 238 during the deposition process. The bias electrode 232 may be, for example, the electrode 232 disposed in the substrate support assembly 238, and coupled to a bias power source 230A and 230B, to bias the substrate support assembly 238 and substrate 203 positioned thereon to a predetermined bias power level while processing.

The bias power source 230A and 230B can be independently configured to deliver power to the substrate 203 and the substrate support assembly 238 at a variety of frequencies, such as a frequency between about 2 and about 60 MHz. Various permutations of the frequencies described here can be employed without diverging from the invention described herein.

Generally, the substrate support assembly 238 is coupled to a stem 242. The stem 242 provides a conduit for electrical leads, vacuum and gas supply lines between the substrate support assembly 238 and other components of the process chamber 200. Additionally, the stem 242 couples the substrate support assembly 238 to a lift system 244 that moves the substrate support assembly 238 between an elevated position (as shown in FIG. 2) and a lowered position (not shown) to facilitate robotic transfer. Bellows 246 provides a vacuum seal between the process volume 212 and the atmosphere outside the chamber 200 while facilitating the movement of the substrate support assembly 238.

The showerhead 218 may generally be coupled to an interior side 220 of the lid 210. Gases (i.e., process gases and/or other gases) that enter the process chamber 200 pass through the showerhead 218 and into the process chamber 200. The showerhead 218 may be configured to provide a uniform flow of gases to the process chamber 200. Uniform gas flow is desirable to promote uniform layer formation on the substrate 203. A remote plasma source 205 can be coupled with the process volume 212 and a gas source 204. Shown here, a remote activation source, such as a remote plasma generator, is used to generate a plasma of reactive species which are then delivered into the process volume 212. Exemplary remote plasma generators are available from vendors such as MKS Instruments, Inc. and Advanced Energy Industries, Inc.

Additionally, a plasma power source 262 may be coupled to the showerhead 218 to energize the gases through the showerhead 218 towards substrate 203 disposed on the substrate support assembly 238. The plasma power source 262 may provide power for the formation of a plasma, such as RF power or microwave power.

The function of the process chamber 200 can be controlled by a computing device 254. The computing device 254 may be one of any form of general purpose computer that can be used in an industrial setting for controlling various chambers and sub-processors. The computing device 254 includes a computer processor 256. The computing device 254 includes memory 258. The memory 258 may include any suitable memory, such as random access memory, read only memory, flash memory, hard disk, or any other form of digital storage, local or remote. The computing device 254 may include various support circuits 260, which may be coupled to the computer processor 256 for supporting the computer processor 256 in a conventional manner.

Software routines, as required, may be stored in the memory 258 or executed by a second computing device (not shown) that is remotely located.

The computing device 254 may further include one or more computer readable media (not shown). Computer readable media generally includes any device, located either locally or remotely, which is capable of storing information that is retrievable by a computing device. Examples of computer readable media useable with embodiments of the present invention include solid state memory, floppy disks, internal or external hard drives, and optical memory (CDs, DVDs, BR-D, etc). In one embodiment, the memory 258 may be the computer readable media. Software routines may be stored on the computer readable media to be executed by the computing device.

The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

Figure 3:
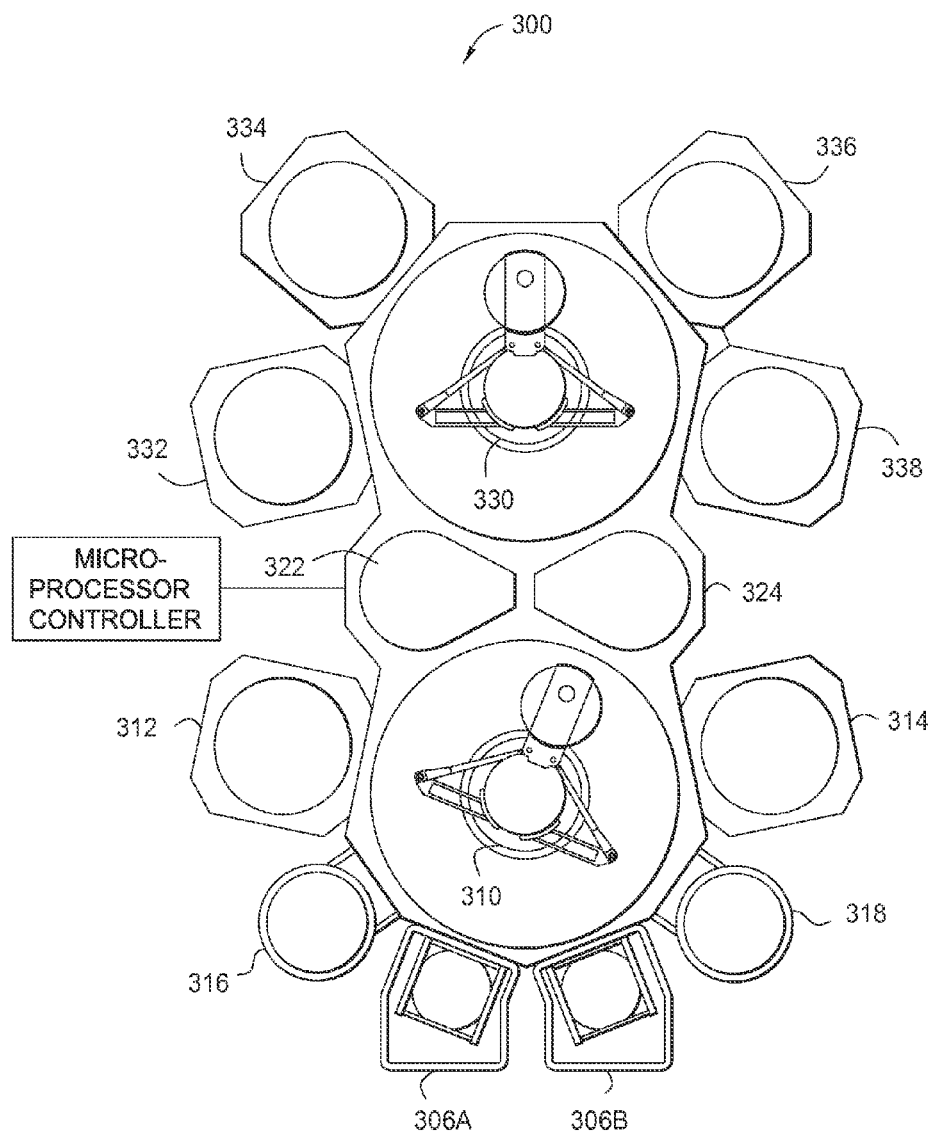
FIG. 3 illustrates an exemplary cluster tool suitable for creating a nanocrystalline diamond layer on a substrate.

The exemplary process chamber 100 or the exemplary process chamber 200 may be part of a cluster tool. FIG. 3 illustrates an exemplary cluster tool 300 suitable for creating a nanocrystalline diamond layer on a substrate. The cluster tool 300 features at least one process chamber 100, as described above. An example of the cluster tool 300 is the Endura® system available from Applied Materials, Inc., of Santa Clara, Calif. Cluster tools manufactured by others may be used as well.

The cluster tool 300 can include one or more load lock chambers 306A, 306B for transferring of substrates into and out of the cluster tool 300. Typically, since the cluster tool 300 is under vacuum, the load lock chambers 306A, 306B may "pump down" the substrates introduced into the cluster tool 300. A first robot 310 may transfer the substrates between the load lock chambers 306A, 306B, and a first set of one or more substrate process chambers 312, 314, 316, 318 (four are shown). Each process chamber 312, 314, 316, 318, can be outfitted to perform a number of substrate processing operations including the etch processes described herein in addition to cyclical layer deposition (CLD), atomic layer deposition (ALD), chemical vapor deposition (CVD), physical vapor deposition (PVD), pre-clean, degas, orientation and other substrate processes.

The first robot 310 can also transfer substrates to/from one or more intermediate transfer chambers 322, 324. The intermediate transfer chambers 322, 324 can be used to maintain ultrahigh vacuum conditions while allowing substrates to be transferred within the cluster tool 300. A second robot 330 can transfer the substrates between the intermediate transfer chambers 322, 324 and a second set of one or more process chambers 332, 334, 336, 338. Similar to process chambers 312, 314, 316, 318, the process chambers 332, 334, 336, 338 can be outfitted to perform a variety of substrate processing operations including the etch processes described herein in addition to cyclical layer deposition (CLD), atomic layer deposition (ALD), chemical vapor deposition (CVD), physical vapor deposition (PVD), pre-clean, thermal process/degas, and orientation, for example. Any of the substrate process chambers 312, 314, 316, 318, 332, 334, 336, 338 may be removed from the cluster tool 300 if not necessary for a particular process to be performed by the cluster tool 300.

An illustrative multi-processing cluster tool 300 can include up to four process chambers 332, 334, 336, 338 (with an option for a fifth chamber between 334 and 336) similarly configured to the process chamber 200 described above. The PVD or ALD chambers 312 or 314 may be configured to deposit a thin ARC/ashing layer (e.g., AlN or SiN or TiN).

The cluster tool 300 may be used to perform the methods described in FIG. 4 and FIG. 5 below. In some process flows, it may be desirable for the substrate to be further processed in the cluster tool 300, or more typically be processed in a separate cluster tool that is configured similarly to the cluster tool shown in FIG. 3.

Figure 4A:
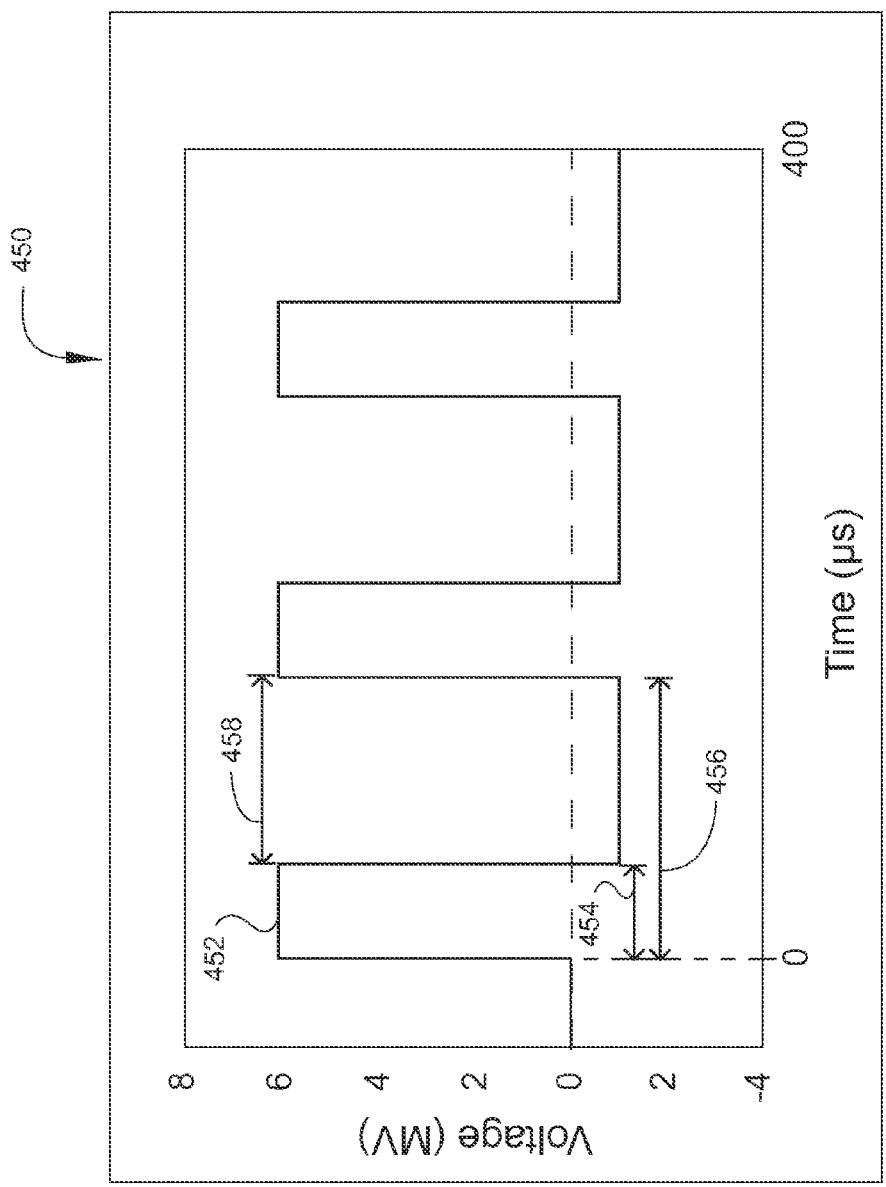
FIG. 4A illustrates an energy delivery process sequence provided to a process chamber to create a high power impulse magnetron sputtering (HIPIMS) process therein, according to an embodiment.

FIG. 4A depicts a graph 450 of a power delivery processing sequence that is used to complete at least a portion of a high power impulse magnetron sputtering (HIPIMS) process. The graph 450 is illustrative of one type of HIPIMS process, and since it is illustrative is generally not drawn to scale. As stated above, typical HIPIMS power sources can deliver power impulses at high voltages over short durations to generate a high density and energy plasma during the HIPIMS process. High voltages can be in the range of such as between about 1,000,000 V and about 8,000,000 V. The power impulse 452 (or energy pulse) can be generated by the power source 132 with a time duration 454 (or pulse width) and a pulse cycle time 456. In one example, the time duration 454 of each power impulse 452 is between about 10 µs and about 40 µs and a pulse cycle time 456 of 200 µs, which corresponding to a pulse repetition frequency of 5000 Hz, i.e. an interval between sequential pulses of 160-190 µs. The power or energy delivered over the pulse cycle time 456 may have a non-square wave shape (not shown) during time duration 454, and thus the average power over the time duration 454 may be at a value between about 10 kilo-Watts (kW) and 100 kW, such as between 10 kW and 40 kW. In some embodiments, each power impulse provided to the target can have equal amounts of power and/or equal durations. However, embodiments of the present disclosure are not so limited. For example, each pulse provided to the target can have a different amount of power and/or a different duration. The values quoted are to be understood purely as by way of example and can be varied in wide limits. For example, one can operate straightforwardly with an impulse duration in the range between 10 µs and 100 µs and with a pulse repetition time between 200 µs and 1 millisecond (ms). The time in which a high power is applied to the target (cathode) is often limited by the rating of the power supply and the time it takes the power supply to recharge during the intervening period 458. It has been found that by the application of high power impulses to the cathode or cathodes, the sputtered material will have a high amount of reactive energy (i.e., chemical potential) and a high degree of ionization. In some examples, the degree of ionization of the sputtered material that emerges from the cathode or the cathodes, may be in the range between 40% and up to 100%. In some embodiments, it is desirable to use this high degree of ionization to cause many more of the sputtered ions to be attracted to the floating or biased substrate, and arrive there with a higher kinetic energy, which leads to denser coatings and a more rapid coating process.

To achieve the high amount of reactive energy and the high degree of ionization of the sputtered material during the HIPIMS process, various processing parameters need to be controlled to assure that the generated sputter material has these desirable properties. In some embodiments, the process parameters include the control of the magnetic field strength of the magnetron positioned adjacent to the target face and the amount of power delivered in the power impulse 452 over the time duration 454 to generate a plasma that has a desirable energy (e.g., electron temperature $T_e$) and plasma density ($N_e$). It has been found that by controlling the pulse width, energy delivered in each pulse and duty cycle of the delivered pulses that a Sp3 containing sputtered carbon material can be formed in a layer on a surface of the substrate.

Figure 7A:
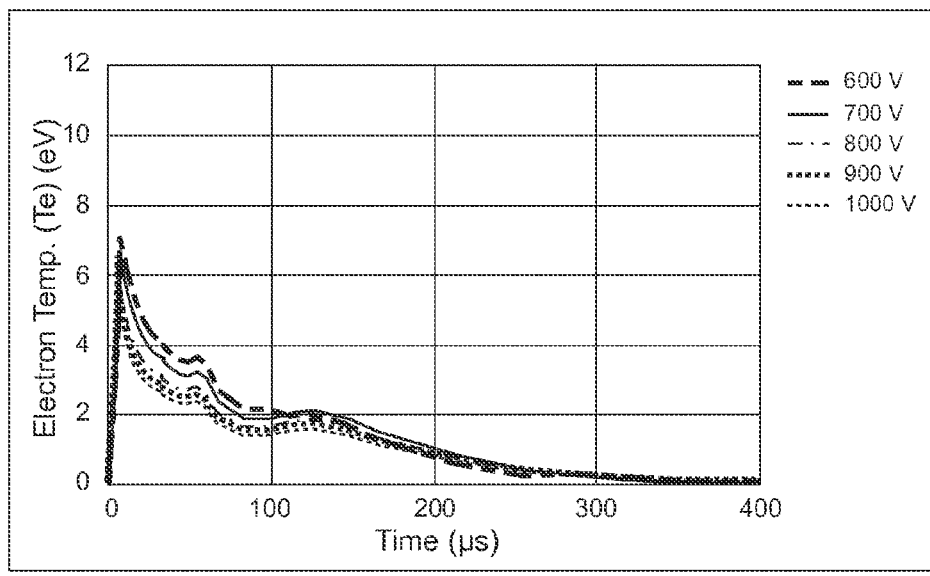
FIGS. 7A and 7B are graphs depicting the effects of pulse voltage on floating voltage and density.
Figure 7B:
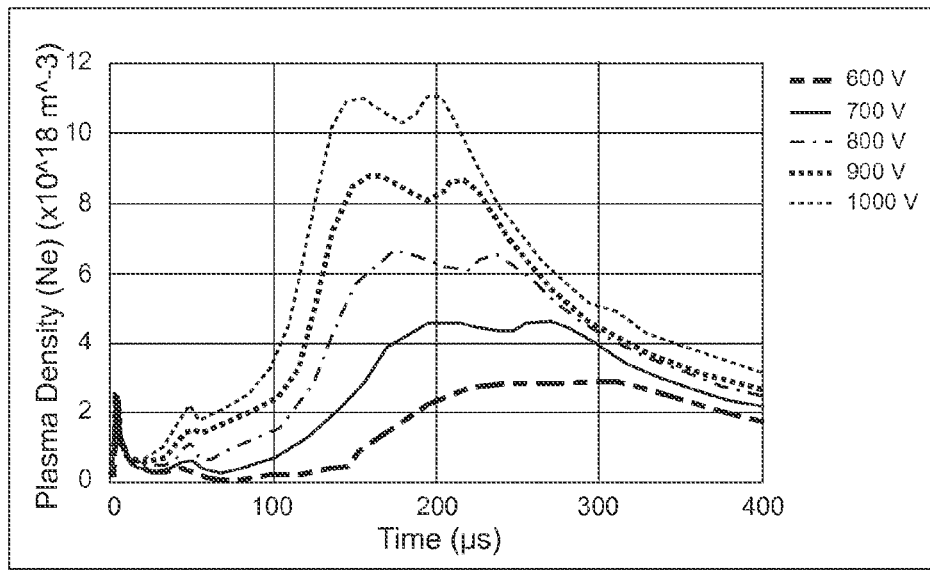

FIGS. 7A and 7B are graphs depicting examples of the effect of target bias (pulse voltage) on the plasma energy (e.g., electron temperature $T_e$) and plasma density. FIG. 7A illustrates the effect of target bias voltage (e.g., power impulse 452) as a function of pulse width on plasma energy (e.g., electron temperature $T_e$). As illustrated in FIG. 7A, at a fixed power set point of the power supply the plasma energy will decrease from an initial peak value to a smaller value as the pulse width increases. The peak plasma energy coincides with the smallest pulse width that is able to generate and sustain a plasma in the processing volume of the processing chamber, which in this example is about 6.5 to 7 electron volts (eV). As the pulse width is increased, while maintaining a fixed power delivery set point (e.g., 20 kWs), the electron temperature or plasma energy drops from the peak value to some lower value. One will note that the plasma energy drops more rapidly for larger target bias voltages, due to the increase in plasma density created as the target bias is increased. It is believed that the drop in plasma energy at different target bias voltages is related to the increased number of collisions between the ions and electrons in the plasma, thus reducing the average plasma energy (e.g., electron temperature $T_e$). One will further note that the plasma energy is also related to the energy that the sputtered atoms will contain as they land on the surface of the substrate, and thus increasing the target bias will also tend to lower the energy of the sputtered atoms in the plasma and that land on the surface of the substrate.

In FIG. 7B, the plasma density is shown as a function of pulse width and target bias voltage. In general, one can see in FIG. 7B, that pulse widths smaller than certain lower limit value at each target bias voltage are ineffective in forming a dense plasma and that pulse widths larger than an upper limit value are similarly ineffective in forming a dense plasma at the same target bias voltage. Therefore, as shown in FIG. 7B, by supplying a power impulse 452 that has a pulse width that is greater than the lower limit value and lower than the upper limit value at a fixed target bias the plasma density ($N_e$) can be maintained at a peak or near peak value. One will note that higher plasma densities will increase the HIPIMS deposition rate and ionization rate of the sputtered atoms that pass through the plasma. One will also note that the peak in the plasma density shifts towards shorter pulse widths as the bias voltage increases, thus the peak plasma density is a function of target bias voltage and pulse width. In one example, a 1000V target bias applied during the power impulse 452 has peak plasma density ($N_e$) at pulse widths between about 125 µs and about 225 µs, which is different than the peak plasma density ($N_e$) at a target bias of 600V, which is between about 175 µs and about 350 µs.

Therefore, to assure that a growing sputter deposited film has desirable physical, chemical and structural properties, such as an Sp3 diamond structure, it is necessary to balance and adjust the competing processing regimes, such as plasma energy (FIG. 7A) and plasma density (FIG. 7B). Therefore, there is a need for a HIPIMS process that includes the selection of a target bias voltage and pulse width that form a plasma that will impart a desirable amount of energy, high ionization rate and degree of ionization to the sputtered atoms to achieve a desirable HIPIMS sputter deposition rate, film crystal structure and film stress.

Further, due to the short pulse width, or time duration 454, used in the HIPIMS process, it has been found that the generation of a "pre-sheath" during the initial stages of the formation of the sputtering plasma has a significant effect on the process of forming the high energy and highly ionized sputtering material. In general, the "pre-sheath" is a non-equilibrium region of the plasma that has a varying size that varies over time, within the processing region (e.g., processing volume 118 in FIG. 1) between the target and the substrate, as the equilibrium plasma sheath region is being formed. Therefore, the ability of the power delivered to the target to be coupled to the sputtering gases (e.g., argon (Ar)), disposed in the processing region of the processing chamber, during the early stages of the process of forming the plasma, has a large effect on the ion energy used to sputter material from the surface of the target. It is believed that the pre-sheath formation process lasts for about the first 10 to 40 µs when the power impulse 452 is applied to the target.

Figure 6:
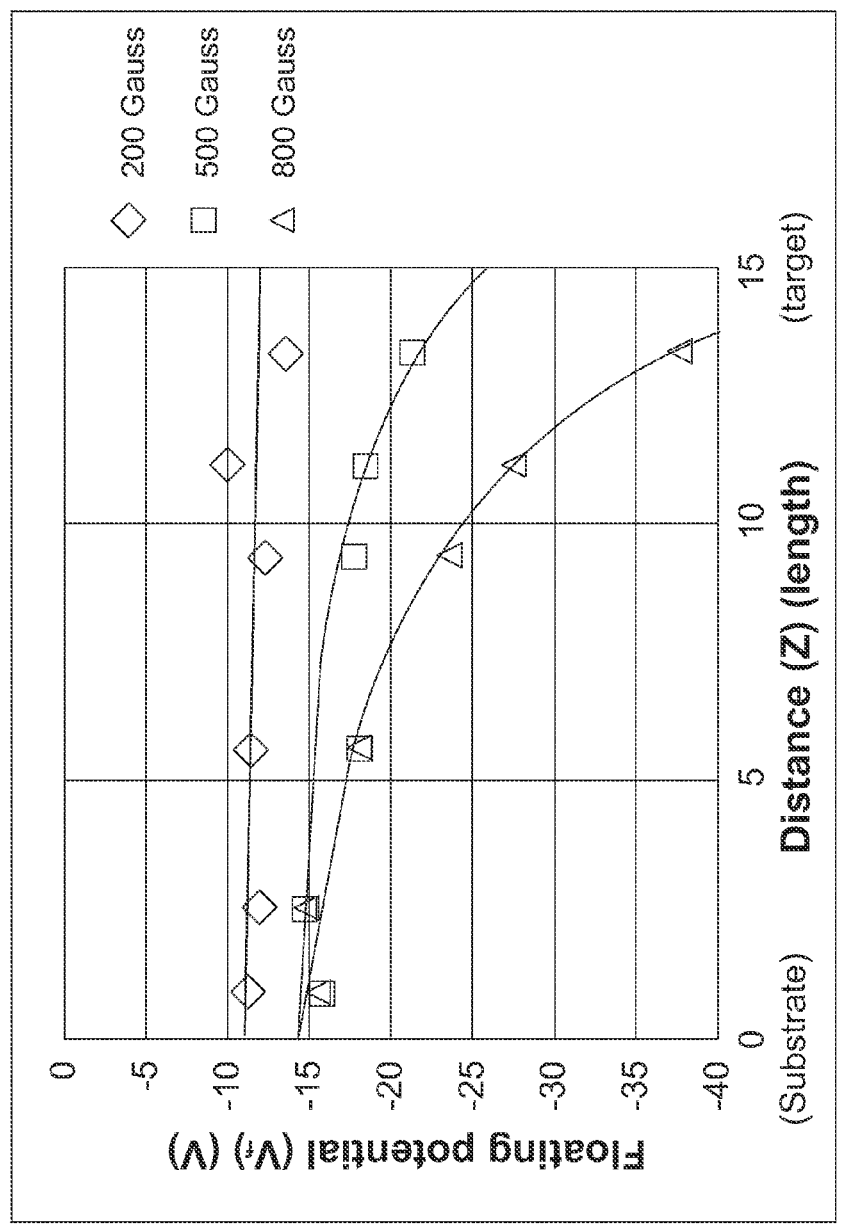
FIG. 6 is a graph illustrating the floating potential as a function of distance from the target for three different magnetic field strengths.

FIG. 6 illustrates a plot of the floating potential formed in a plasma as a function of distance from the target for different magnetrons that each have a different magnetic field strength. As shown in FIG. 6, a 200 Gauss magnetron is represented by diamonds, with a first corresponding curve; a 500 Gauss magnetron is represented by squares, with a second corresponding curve; and an 800 Gauss magnetron is represented by triangles, with a third corresponding curve. These examples include the use of a 50 µs pulse width HIPIMS process that utilizes the same target bias voltage and power for each of the magnetron configurations. Of note, the floating potential does not significantly vary between the target and the substrate for the 200 Gauss magnetron assembly. For the 500 Gauss example, the floating potential between the target and the substrate is also substantially constant near the substrate end of the chamber, but tends to drop off (e.g., the plasma has an increasingly negative floating potential) as one moves closer to the surface of the target. For the 800 Gauss example, the electric potential between the target and the substrate is significantly different, since the floating potential dramatically drops off as one moves from the surface of the substrate towards the surface of the target. One skilled in the art will appreciate that a higher magnetron magnetic field strength will increase the ability of magnetron to capture electrons emitted from the biased target's surface due to the increased magnetic field strength (e.g., number of magnetic field lines that pass through the surface of the target). One skilled in the art will also appreciate that a low magnetic field strength (e.g., <<200 Gauss) magnetron are also undesirable, since these low magnetic fields will typically not effectively capture electrons emitted from the target during the sputtering process. The electrons captured by the magnetic field are generally used to improve the ionization of the sputtering gases and sputtered material, and thus the use of the low magnetic field strength magnetrons prevent a uniform and reliable plasma to be formed.

It is believed that using a magnetron assembly that does not provide a substantially flat floating potential ($V_f$) profile, such as the profile generated by the 200 Gauss magnetron, the first corresponding curve shown in FIG. 6, will have reduced ability to extract ions from the plasma. In other words, as the magnetic field generated by a magnetron is increased, the magnetron's ability to trap ions in the plasma near the target face increases, and thus this prevents the gas ions and ionized sputtered material from being attracted to the floating, grounded or biased substrate during processing.

The inability to extract ions from the plasma will affect the deposition rate and energy of the sputtered material that is used to form the deposited layer on the substrate surface. Therefore, in some embodiments, it is desirable to select a magnetron that has a substantially flat floating potential profile.

In some embodiments, to assure that a growing sputter deposited film has desirable physical, chemical and structural properties, such as an Sp3 diamond structure, it is necessary to balance, adjust and/or control the plasma energy, plasma density and also select a desirable magnetic field strength supplied by the magnetron assembly. Therefore, there is a need for a HIPIMS process that includes the selection of a magnetron assembly that has a desirable magnetic field strength to provide a desirable floating potential profile (e.g., substantially flat profile) and a target bias voltage and pulse width that form a plasma that will impart a desirable amount of energy, high ionization rate and degree of ionization to the sputtered atoms to achieve a desirable HIPIMS sputter deposition rate, film crystal structure and film stress.

Figure 4B:
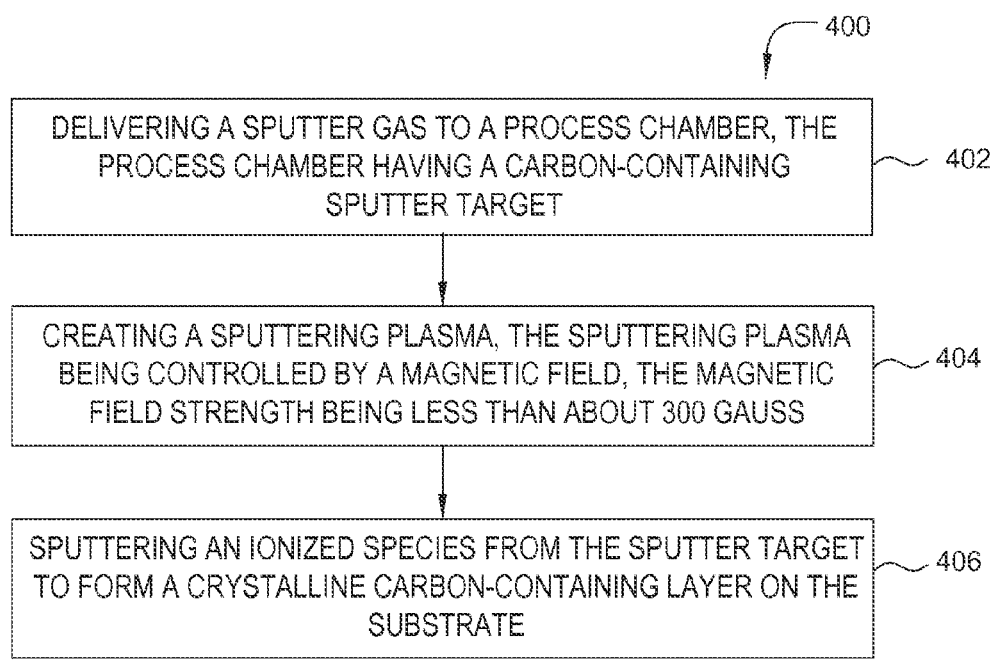
FIG. 4B is a flow diagram of a method for depositing a nanocrystalline diamond layer, according to an embodiment.

FIG. 4B is a flow diagram of a method for depositing a nanocrystalline diamond layer in a PVD process chamber, such as process chamber 200. As noted above, as the magnetic field strength is increased, the ability to extract ions from the plasma during the pre-sheath generation phase of the plasma formation process becomes more difficult. A lower Gauss level allows the plasma to form closer to the target so it doesn't affect the pre-sheath formation. Thus, by reducing the magnetic field strength to less than 300 Gauss, such as about 200 Gauss, a shorter pulse time may be used to create a desirable pre-sheath. Therefore, the interplay between the magnetic field and the pulse time allows for a high deposition rate for nanocrystalline diamond deposition while maintaining deposition quality and at low temperature, such as room temperature.

The method 400 generally includes delivering a sputter gas to a processing region of a process chamber, the process chamber having a substantially carbon-containing sputter target. Then deliver an energy pulse to the sputter gas to create a sputtering plasma. In one example, the sputtering plasma has a sputtering duration, the energy pulse having an average power between 1 W/cm$^2$ and 10 W/cm$^2$ and a pulse width which is less than 100 μs and greater than 30 μs, the sputtering plasma being controlled by a magnetic field, the magnetic field being less than 300 Gauss. Thereby forming the sputtering plasma in the processing volume that is adjacent to the substantially carbon-containing sputter target to form a sputtered and ionized carbon containing species, the sputtered and ionized carbon containing species forming a crystalline carbon-containing layer on the substrate.

The method 400 begins by delivering a sputter gas to a processing volume of a process chamber, the process chamber having a carbon-containing sputter target, at 402. In one example, the process chamber is the process chamber 200, described above with reference to FIG. 2. In another example, the process chamber is a process chamber that is modified to perform the operations described herein. The process chamber has a carbon-containing target, such as a graphitic target. The sputter gas is generally a gas which is inert to the substrate or the sputter target. In one example, the sputtering gas is argon.

With the substrate positioned in the processing volume, a series of energy pulses are delivered to the sputter gas to create a sputtering plasma, at 404. The sputtering plasma can be formed using the energy delivery process described in conjunction with FIG. 4A. In general, the energy pulses are provided during this phase of the process includes the selection of a target bias voltage and pulse width that form a plasma that will impart a desirable amount of energy to achieve a desirable plasma energy (e.g., electron temperature $T_e$) and plasma density ($N_e$) to achieve a high ionization rate and degree of ionization to the sputtered atoms to achieve a desirable HIPIMS sputter deposition rate, film crystal structure and film stress. In one example, the energy pulses used to form the sputtering plasma can each have an average power between 1 W/cm$^2$ and 10 W/cm$^2$. It should be noted that the magnetron's magnetic field strength during this process step was also selected to assure that a desirable pre-sheath is formed, due to the short pulse width utilized in this HIPIMS PVD process, and a desirable amount of ion extraction from the plasma is created at the substrate surface. The magnetron's magnetic field may be less than 300 Gauss, such as about 200 Gauss.

Without intending to be bound by theory, it is believed that the creation of a stable pre-sheath is beneficial to low temperature deposition of nanocrystalline diamond. During the plasma formation process, initially the electric field is fairly high. At the beginning of plasma formation, the plasma itself ends up occupying a comparatively large volume. And then the sheath shrinks down and densifies to the point that it accommodates all current flowing into the processing volume of the process chamber. The pre-sheath is formed right before the shrinking and densifying of the positively charged particles around the target. The presheath affects the dynamics of energy, ionization fraction and sputter fraction of the sputtered target. Prior HIPIMS techniques provide a deposition rate which is measurably less than standard PVD deposition. It has been found that by controlling the energy delivery process (FIG. 4A) to the processing volume a desirable plasma energy ($T_e$) and plasma density ($N_e$) is imparted to the plasma so that the formed pre-sheath, formed in the early phases and sustained during a large portion of the power delivery portion of the HIPIMS PVD process described herein, will contain desirable properties that enables the HIPIMS PVD process to have a high deposition rate and provide enough energy to the sputtered atoms to allow the formation of an Sp3 carbon layer on a substrate.

Once the plasma is formed, the sputtering plasma is delivered to the sputter target to form an ionized species, the ionized species forming a crystalline carbon-containing layer on the substrate, at 406. The sputtering power, the duty cycle and the magnetic field, as described above, allow for an increased fraction of Sp3 over Sp2 deposition on the substrate.

Figure 5:
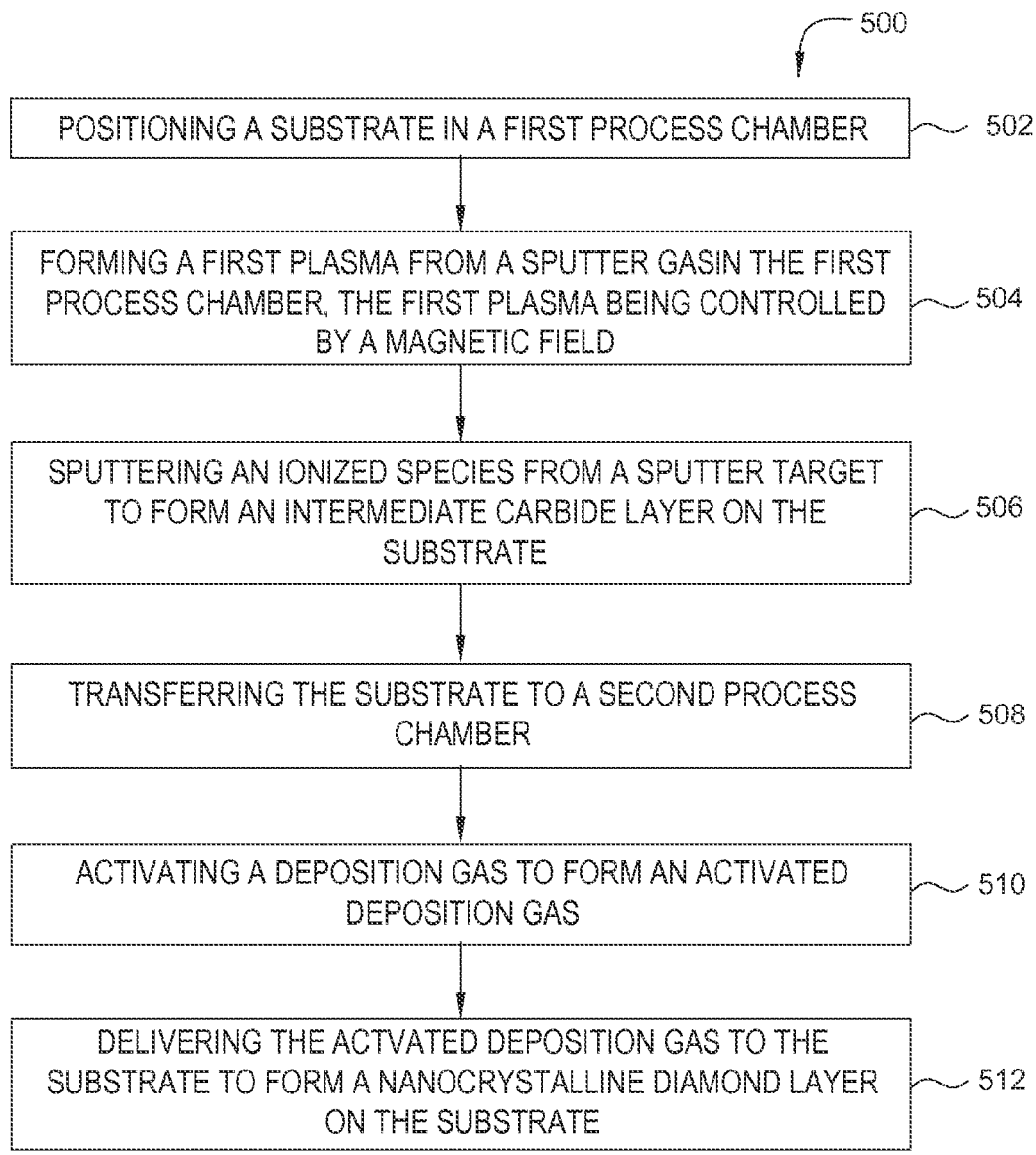
FIG. 5 is a flow diagram of a method for depositing a intermediate carbide layer, according to an embodiment.

FIG. 5 is a flow diagram of a method for forming an intermediate carbide layer, according to embodiments described herein. A carbide layer is believed to be beneficial to the growth of a nanocrystalline diamond layer, as differentiated from a diamond like carbon layer. In another embodiment, the HIPIMS PVD method described above may be used to form one or more intermediate layers. Once the intermediate layers are formed, the nanocrystalline diamond layer may be grown using a secondary growth method, such as CVD method. The method 500 includes positioning a substrate in a first HIPIMS PVD process chamber (e.g., process chamber 100), the first process chamber having a carbon-containing sputter target and a sputter gas, at 502; delivering a series of energy pulses to the sputter gas to form a first plasma using an energy delivery process (e.g., illustrated in FIG. 4A). The first plasma being controlled by a magnetic field, at 504. Thereby delivering the first plasma to the sputter target to form an ionized species, so that the ionized species forming an intermediate carbide layer on the substrate, at 506. Then transferring the substrate to a second process chamber, at 508. While in the second processing chamber forming a plasma in the presence of a nucleation gas to form an activated nucleation gas, wherein the nucleation gas comprises a carbon-containing source. Then activating the nucleation gas to form a nucleation layer on the substrate, at 510. Then activating a deposition gas to form an activated deposition gas, at 512. Then delivering the activated deposition gas to the substrate, the activated deposition gas forming a nanocrystalline diamond layer on the substrate, at 514.

The method 500 begins by positioning a substrate in a first process chamber, the first process chamber having a carbon-containing sputter target and a sputter gas, at 502. The substrate can be of any composition, such as a crystalline silicon substrate. The substrate can also include one or more features, such as a via or an interconnect formed in a surface of the substrate. The substrate can be supported on a substrate support. In one embodiment, the sputter target and the sputter gas used in this embodiment, is the same as described above in conjunction with FIGS. 4A-4B.

A "substrate surface", as used herein, refers to any substrate or material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. A substrate surface may also include dielectric materials such as silicon dioxide and carbon doped silicon oxides. Substrates may have various dimensions, such as 200 mm, 300 mm, 450 mm or other diameter wafers, as well as rectangular or square panes.

An energy pulse can then be delivered to the sputter gas to form a first plasma, at element 504. In one embodiment, the energy pulse is high power impulse magnetron sputtering (HIPIMS) impulse, as discussed above. The pulse power, pulse time, average power, magnetic field strength and other parameters of the HIPIMS process may be the same as described in conjunction with FIGS. 4A-4B.

As noted above, the HIPIMS PVD process utilizes high power densities of the order of $kW \cdot cm^{-2}$ in short pulses (impulses) of tens of microseconds at low duty cycle (on/off time ratio) of <10%. Distinguishing features of HIPIMS are a high degree of ionization of the sputtered material and a high rate of molecular gas dissociation which result in high density of deposited films. The ionization and dissociation degree increase according to the peak cathode power. The magnetic field strength is selected such that a short pulse may be used while maintaining a low electric potential difference between the target and the substrate, such as less than 300 Gauss (for example, about 200 Gauss).

In one or more embodiments, each pulse provided to target can have an average power of at least 1 kilowatt. In some embodiments, each pulse provided to target can have a power of at least 1 megawatt. For example, each pulse can have a power of approximately 1-3 megawatts. Additionally, in one or more embodiments, each pulse provided to the target can have a duration of approximately 1 microsecond to 300 microseconds, such as between 10 and 100 microseconds. In some embodiments, each pulse provided to the target can have a duration of approximately 1 microsecond to 200 microseconds or a duration of approximately 100 microseconds to 200 microseconds. For example, each pulse can have a duration of approximately 50 microseconds.

Further, in one or more embodiments, each pulse provided to the target can be separated by a duration of approximately 100 milliseconds. That is, there can be 100 milliseconds between each pulse provided to the target. However, embodiments of the present disclosure are not limited to a particular duration.

A sputter plasma can then be delivered to the sputter target to form an ionized species, the ionized species forming an intermediate carbide layer on the substrate, at element 506. The sputter target can be a carbon containing target, such as a graphite target. The ionization degree of the target vapor is a function of the peak current density of the discharge as well as the pulse width and the magnetic field strength. In one embodiment, the energy pulse can have a power between 1 $W/cm^2$ and 10 $W/cm^2$, a duty cycle of less than 10% and a pulse length of between about 10 microseconds and 100 microseconds.

The ionized species reaches the substrate, forming an intermediate carbide layer on the substrate. The intermediate carbide layer acts as a seed layer for further deposition.

The substrate can be transferred to a second process chamber, at 508. The process chamber used with one or more embodiments can be any CVD process chamber with a remote plasma source, such as the process chamber 100 described above or chambers from other manufacturers. Flow rates and other processing parameters described below are for a 300 mm substrate. It should be understood these parameters can be adjusted based on the size of the substrate processed and the type of chamber used without diverging from the invention disclosed herein.

Optionally, the substrate can then be biased. The bias can be part of a bias-enhanced nucleation process. In case of bias-enhanced nucleation, the substrate can be a negative bias. In one example, the substrate is biased with bias pretreatment. The bias can have a current of between about 100 milliAmps and about 200 milliAmps. The bias can have a voltage of between about 150 Volts and about 250 Volts.

Then, a plasma can be formed in the presence of a deposition gas to form an activated deposition gas, at element 510. The plasma can be formed from the deposition gas or a secondary gas, such as an inert gas. The plasma can be formed either locally or remotely. The deposition gas can be activated by forming a plasma using a power source. Any power source capable of activating the gases into reactive species and maintaining the plasma of reactive species may be used. For example, radio frequency (RF), direct current (DC), or microwave (MW) based power discharge techniques may be used. The deposition gas can comprise a carbon-containing source, a hydrogen-containing source, an inert gas or combinations thereof.

The carbon-containing precursor can be an alkane, alkene, or alkyne precursor. The alkane precursor can be a saturated unbranched hydrocarbon, such as Methane, Ethane, Propane, and combinations thereof. Other alkane precursors include n-Butane, n-Pentane, n-Hexane, n-Heptane, n-Octane, and combinations thereof. The hydrogen containing gas can include $H_2$, $H_2O$, $NH_3$ or other hydrogen containing molecules. The deposition gas can further include an inert gas. The inert gas can be a noble gas, such as argon.

The activated deposition gas can then be delivered to the substrate, the activated deposition gas growing a nanocrystalline diamond layer on the nucleation layer, at element 512. The radicals from the previously formed activated deposition gas impinge on the substrate surface to form the nanocrystalline diamond layer. The substrate surface, as used herein, may include any layers formed on the substrate surface, such as the intermediate carbide layer.

The method described above teaches the formation of at least an intermediate carbide layer for the growth of a nanocrystalline diamond layer. By depositing a uniform intermediate carbide layer, nanocrystalline diamond can be deposited conformally and with reduced roughness.

While the foregoing is directed to embodiments of the present invention, other and further embodiments of the invention may be devised without departing from the basic scope thereof, and the scope thereof is determined by the claims that follow.

The invention claimed is:

1. A method of forming a carbon-containing layer, comprising:
delivering a sputter gas to a substrate positioned in a processing region of a first process chamber, the first process chamber having a carbon-containing sputter target;
delivering an energy pulse to the sputter gas to create a sputtering plasma, the sputtering plasma being formed by energy pulses having an average power between about 1 W/cm$^2$ and about 10 W/cm$^2$ and a pulse width which is less than 100 µs and greater than 30 µs, the sputtering plasma being exposed to a magnetic field that is less than 300 Gauss;
forming an ionized species comprising a carbon containing material sputtered from the carbon-containing sputter target, wherein the ionized species forms a crystalline carbon-containing layer on the substrate, and wherein the substrate is maintained at a temperature of less than 100 degrees Celsius;
providing a bias to the substrate;
forming a plasma in the presence of a deposition gas to form an activated deposition gas, the deposition gas comprising a carbon-containing source; and
delivering the activated deposition gas to the substrate to form a nanocrystalline diamond layer on the crystalline carbon-containing layer.

2. The method of claim 1, wherein the deposition gas further comprises a hydrogen source.

3. The method of claim 1, wherein the deposition gas comprises $CH_4$, $H_2$, Ar, $CO_2$ or combinations thereof.

4. The method of claim 1, wherein the sputter target is a graphitic target.

5. The method of claim 1, wherein the substrate is maintained at a pressure between about 2 mTorr and about 20 mTorr.

6. The method of claim 1, wherein the crystalline carbon-containing layer is a nanocrystalline diamond layer.

7. The method of claim 1, wherein the deposition gas is activated using a microwave source.

8. The method of claim 1, wherein the energy pulse is between about 10 microseconds and 100 microseconds.

9. The method of claim 1, wherein the magnetic field is less than about 200 Gauss.

10. A method for forming a carbon-containing layer, comprising:
delivering a sputtering gas to a substrate positioned in a processing region of a first process chamber, the first process chamber having a graphitic target;
delivering an energy pulse to the sputter gas to create a sputtering plasma, the sputtering plasma being formed by an energy pulse having an average power between about 1 W/cm$^2$ and about 10 W/cm$^2$ and a pulse width which is less than 100 µs, the sputtering plasma being controlled by a magnetic field, the magnetic field being less than 300 Gauss;
forming the sputtering plasma so that an intermediate carbide layer is formed on the substrate, wherein the substrate is maintained at a temperature range of below about 100 degrees Celsius;
transferring the substrate having the intermediate carbide layer to a second process chamber;
delivering a deposition gas to the second process chamber;
activating the deposition gas to create an activated deposition gas, the deposition gas comprising $CH_4$, $H_2$, Ar, $CO_2$ or combinations thereof;
delivering the activated deposition gas to a substrate; and
growing a nanocrystalline diamond layer on the intermediate carbide layer.

11. The method of claim 10, wherein the substrate is maintained at a pressure between about 2 mTorr and about 20 mTorr.

12. The method of claim 10, wherein the duty cycle is less than about 10% of the of the sputtering duration.

13. The method of claim 10, wherein the deposition gas is activated using a microwave source.

14. The method of claim 10, wherein the energy pulse is between about 10 microseconds and 100 microseconds.

15. The method of claim 10, wherein the magnetic field is less than about 200 Gauss.

16. A method for forming a carbon containing layer, comprising:
delivering a sputter gas to a substrate positioned in a processing region of a PVD process chamber, the PVD process chamber having a graphitic sputter target;
delivering an energy pulse to the sputter gas to create a sputtering plasma, the sputtering plasma being formed by energy pulses having an average power between 1 W/cm$^2$ and 10 W/cm$^2$ and a pulse width which is less than 100 µs and greater than 30 µs, the sputtering plasma being exposed to a magnetic field that is less than 300 Gauss;
delivering the sputtering plasma to the graphitic sputter target to form a crystalline carbon-containing layer on the substrate;
delivering an inert gas to the substrate positioned in the processing region of the PVD process chamber;
maintaining the PVD process chamber at a temperature of less than 100 degrees Celsius;
delivering an energy pulse to the inert gas to create a sputtering plasma, the sputtering plasma having a sputtering duration, the energy pulse having an average power between 1 W/cm$^2$ and 10 W/cm$^2$, a pulse voltage which is greater than the average power and a pulse width which is less than 100 µs, the sputtering plasma being controlled by a magnetic field, the magnetic field being less than or equal to 200 Gauss; and
delivering the sputtering plasma to the graphitic sputter target to form a nanocrystalline diamond layer on the crystalline carbon-containing layer.

17. The method of claim 16, wherein the substrate is maintained at a pressure between about 2 mTorr and about 20 mTorr.

* * * * *